(12) United States Patent
Xiong et al.

(10) Patent No.: US 10,148,287 B2
(45) Date of Patent: Dec. 4, 2018

(54) BIT-FLIPPING LDPC DECODING ALGORITHM WITH HARD CHANNEL INFORMATION

(71) Applicant: SK hynix Inc., Gyeonggi-do OT (KR)

(72) Inventors: Chenrong Xiong, San Jose, CA (US); Fan Zhang, Fremont, CA (US); Aman Bhatia, San Jose, CA (US); Abhiram Prabhakar, Fremont, CA (US); HongChich Chou, Milpitas, CA (US); Naveen Kumar, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/346,158

(22) Filed: Nov. 8, 2016

(65) Prior Publication Data

US 2018/0131389 A1     May 10, 2018

(51) Int. Cl.
 *H03M 13/11*     (2006.01)
 *G06F 3/06*      (2006.01)
 *G06F 11/10*     (2006.01)
 *G11C 29/52*     (2006.01)

(52) U.S. Cl.
 CPC ......... *H03M 13/1108* (2013.01); *G06F 3/064* (2013.01); *G06F 3/067* (2013.01); *G06F 3/0619* (2013.01); *G06F 11/1068* (2013.01); *G11C 29/52* (2013.01); *H03M 13/1128* (2013.01)

(58) Field of Classification Search
 CPC ......... H03M 13/1108; H03M 13/1137; H03M 13/1171
 See application file for complete search history.

(56) References Cited

U.S. PATENT DOCUMENTS

| | | | |
|---|---|---|---|
| 8,312,354 B1 * | 11/2012 | Varnica | H03M 13/1105 714/780 |
| 9,385,753 B2 * | 7/2016 | Varnica | H03M 13/1108 |
| 9,614,547 B2 * | 4/2017 | Fainzilber | H03M 13/1108 |
| 9,614,548 B1 * | 4/2017 | Nguyen | H03M 13/1108 |
| 2016/0179620 A1 * | 6/2016 | Bazarsky | H03M 13/116 714/766 |

* cited by examiner

*Primary Examiner* — Vanthu T Nguyen
(74) *Attorney, Agent, or Firm* — IP & T Group LLP (57) ABSTRACT

Memory systems may include a memory storage, and an error correcting code (ECC) unit suitable for determining a number of unsatisfied check nodes of a channel output in a decoding iteration of a decoding process, updating a flipping indicator of a variable node, comparing the flipping indicator of the variable node with a flipping threshold associated with the decoding process, flipping a bit of the variable node when the flipping indicator is greater than the flipping threshold, and ending the decoding process when decoding is determined to be successful or a maximal iteration number is reached.

15 Claims, 5 Drawing Sheets

BIT-FLIPPING LDPC DECODING ALGORITHM WITH HARD CHANNEL INFORMATION

BACKGROUND

1. Field

Exemplary embodiments of the present disclosure relate to a memory system and an operating method thereof.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

Data written in flash memory (e.g., NAND) is subject to read errors, the data is typically protected by error correcting codes. The error correcting codes may still fail in some cases. Thus, there exists a need for improved error correcting codes and processes for overcoming read errors.

SUMMARY

Aspects of the invention include memory systems. The memory systems may include a memory storage, and an error correcting code (ECC) unit suitable for determining a number of unsatisfied check nodes of a channel output in a decoding iteration of a decoding process, updating a flipping indicator of a variable node, comparing the flipping indicator of the variable node with a flipping threshold associated with the decoding process, flipping a bit of the variable node when the flipping indicator is greater than the flipping threshold, and ending the decoding process when decoding is determined to be successful or the maximal iteration number is reached.

Further aspects of the invention include methods. The methods may include determining a number of unsatisfied check nodes of a channel output in a decoding iteration of a decoding process, updating a flipping indicator of a variable node, comparing the flipping indicator of the variable node with a flipping threshold associated with the decoding process, flipping a bit of the variable node when the flipping indicator is greater than the flipping threshold, and ending the decoding process when decoding is determined to be successful or the maximal iteration number is reached.

Additional aspects of the invention include memory devices. The memory devices may include a memory storage, and an error correcting code (ECC) unit configured to, determine a number of unsatisfied check nodes of a channel output in a decoding iteration of a decoding process, update a flipping indicator of a variable node, compare the flipping indicator of the variable node with a flipping threshold associated with the decoding process, flip a bit of the variable node when the flipping indicator is greater than the flipping threshold, and end the decoding process when decoding is determined to be successful or the maximal iteration number is reached.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
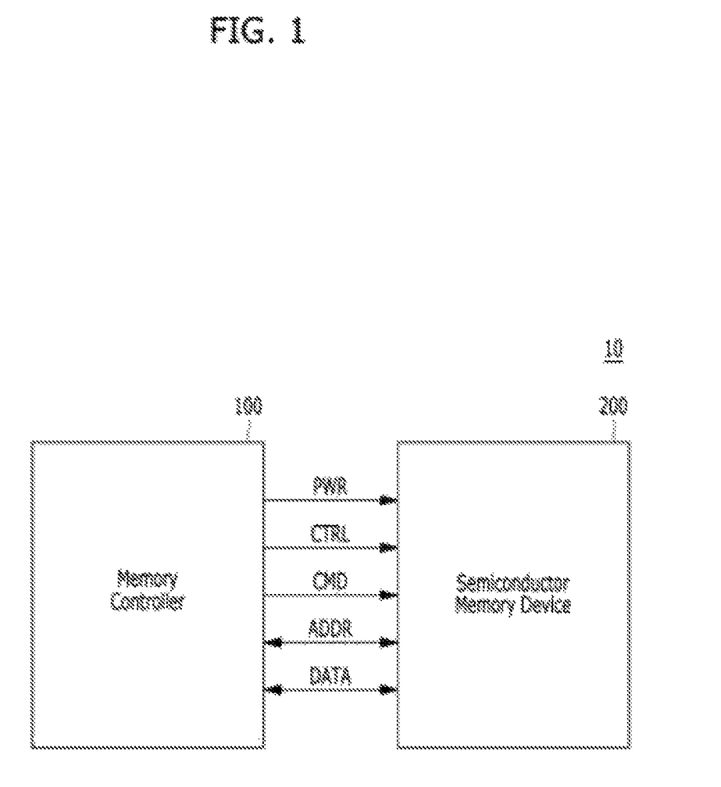
FIG. 1 is a block diagram schematically illustrating a memory system in accordance with an embodiment of the present invention.

FIG. 1 is a block diagram schematically illustrating a memory system 10 in accordance with an embodiment of the present invention.

Referring FIG. 1, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
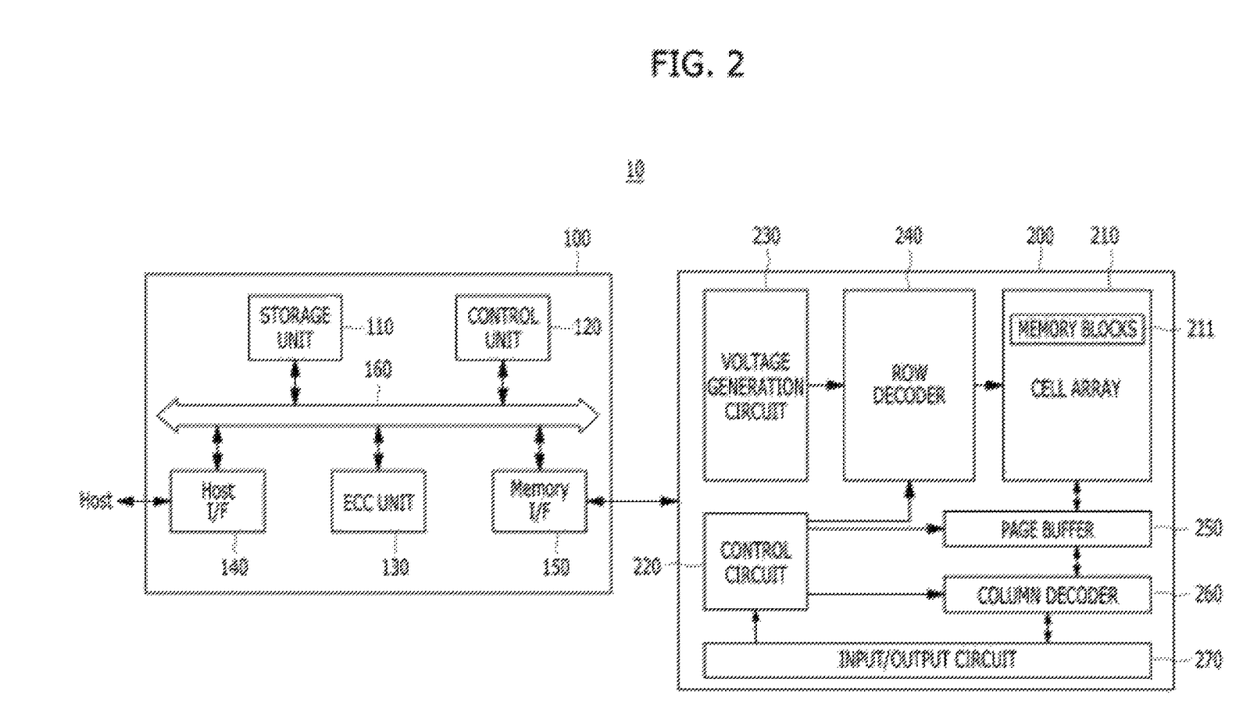
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
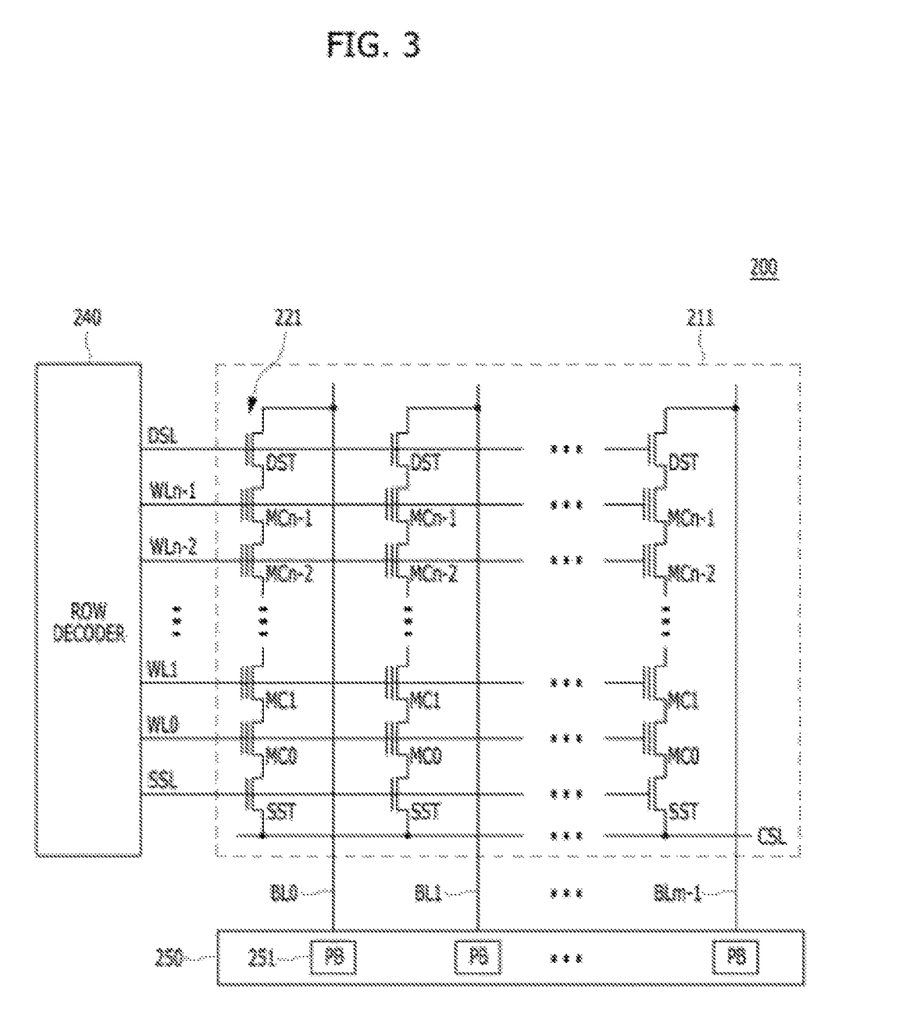
FIG. 3 is a circuit diagram illustrating a memory block of a memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 4:
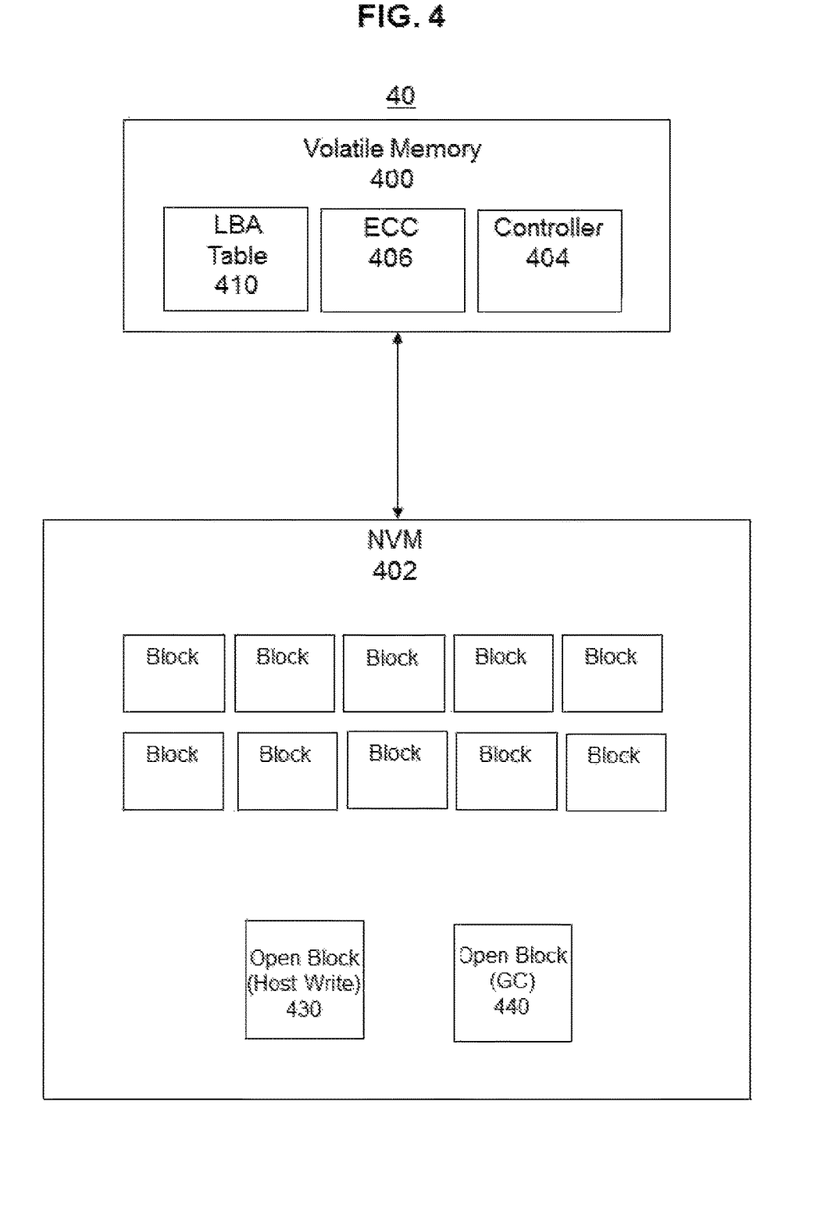
FIG. 4 is a diagram of an example memory system in accordance with aspects of the invention.

At FIG. 4, a general example of a memory system 40 is shown. The memory system 40 may include a volatile memory 400 (e.g., a DRAM) and a non-volatile memory (NVM) 402 (e.g., NAND) in communication with the volatile memory 400. The volatile memory 400 may include a controller 404, such as the controllers described herein, an error correcting code module 406, and a logical bit address LBA table 410 for mapping physical to logical addresses of bits. The NVM 402 may include a plurality of memory blocks (and/or a plurality of super memory blocks), as well as an open block for host writes 430 and an open block for garbage collection (GC) 440. The memory system 40 shows a general memory system, and additional/alternative components that may be utilized with memory systems to effectuate the invention disclosed herein will be understood to those of skill in the art.

As referred to herein, terms such as "NAND" or "NVM" may refer to non-volatile memories such as flash memories which may implement error correcting code processes. Further, "DRAM" may refer to volatile memories which may include components such as controllers and ECC modules Low-density parity-check (LDPC) codes are a family of linear block forward error-correction (FEC) codes whose parity check matrix can be represented by a low-density parity-check matrix. There are many iterative decoding algorithms for LDPC codes, such as bit-flipping (BF) decoding algorithms, belief-propagation (BP) decoding algorithms, sum-product (SP) decoding algorithms, min-sum decoding algorithms, Min-Max decoding algorithms, etc.

Usually in BF algorithms, there are two factors used in determining whether and where a variable node needs to be flipped or not. The first factor may be referred to the flipping indicator of each variable node. u(j) is used herein to represent the flipping indicator of variable node j. The second factor may be referred to a flipping threshold, referred to as T herein. In each iteration, u(j) and T are calculated based on some rules. After calculating/determining u(j) and T, whether variable node j is to be flipped or not is based the relationship between u(j) and T. For example, if u(j) is greater than T, variable node j is to be flipped. Otherwise, variable node j is still the same as the decision of a previous iteration.

If only the hard channel information is provided, u(j) takes into account only the number of unsatisfied check nodes connected to variable node j and does not take advantage of the channel information of variable node j. In the BF algorithms disclosed herein, both the number of unsatisfied check nodes adjacent to variable node j and the hard channel information of variable node j are used. In addition to the calculation method of u(j), an adaptive flipping threshold T calculation flow is also disclosed. By applying these two improvements, the error correction performance of a BF algorithm may be improved significantly.

Figure 5:
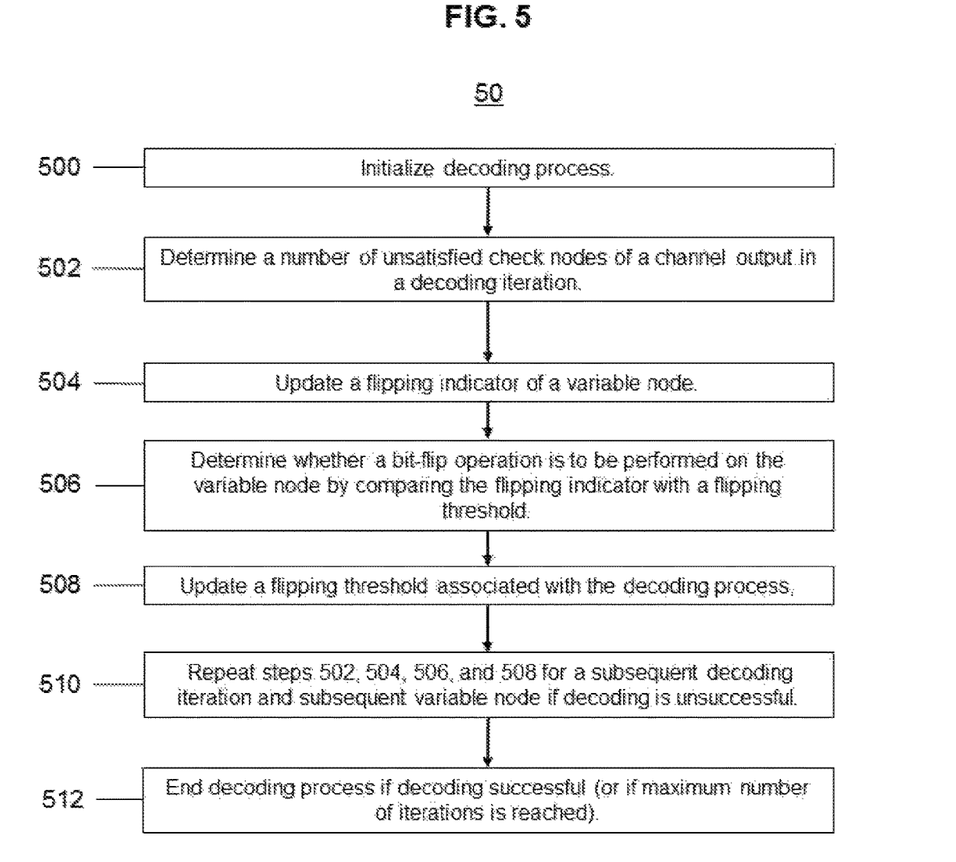
FIG. 5 is a flowchart of steps in a method for decoding according to aspects of the invention.

FIG. 5 is a flowchart 50 of steps in example processes for decoding in accordance with aspects of the invention. The steps shown in flowchart 50 are exemplary and not exclusive, such that those of skill in the art will understand additional steps, alternative steps, alternative orders of steps, etc. that may be performed in order to effectuate the invention without departing from the inventive concepts disclosed herein. The steps 500-512 may be performed by the memory components described herein, such as a controller, DRAM, ECC unit, and/or other suitable components as will be understood by the disclosure herein (e.g., the components described above with respect to FIGS. 1-4).

At step 500, a decoding process is initialized. For example, suppose that $x=[x_0, x_1, \ldots, x_{N-1}]$ is a bit vector, and $H=[h_{i,j}]$ is an M×N low-density parity-check matrix with a binary value $h_{i,j}$ at the intersection of row i and column j. Then each row of H provides a parity check for x. If x is a codeword of H, then $xH^T=0$. In examples, x is transmitted over a noisy channel, and the corrupted channel output is $y=[y_0, y_1, \ldots, y_{N-1}]$. The syndrome of y is a binary vector calculated by $s=[s_0, s_1, \ldots, s_{M-1}]=yH^T$, with a weight of $\|s\|$ which represents the number of unsatisfied check nodes. Thus, the decoding process may be initialized by determining x, s, y, H, etc.

At step 502, a number of unsatisfied check nodes of a channel output in a decoding iteration is determined. As used herein, $\|s_j\|$ denotes the number of unsatisfied check nodes connected with variable node j. Variable node j may represent the current variable node for which the decoding iteration is processing as is described herein. Thus, the number of unsatisfied check nodes for the decoding iteration processing variable node j is $\|s_j\|$ with a channel output of $y_j$.

At step 504, a flipping indicator of a variable node is updated. The flipping indicator u(j) may be updated for variable node j. For example, assuming t ($0 \leq t \leq t_{max}$) represents the iteration number, $d_j^{(t)}$ denotes the decision (e.g., hard decision, hard channel information, etc.) of variable node j of the t-th iteration, and $d^{(t)}=[d_0^{(t)}, d_1^{(t)}, \ldots, d_{N-1}^{(t)}]$. $s^{(t)}=[d_0^{(t)}, d_1^{(t)}, \ldots, d_{N-1}^{(t)}] H^T$. Suppose $d^{(-1)}=[d_0^{(-1)}, d_1^{(-1)}, \ldots, d_{N-1}^{(-1)}]=y$, then $s^{(-1)}=yH^T$. The flipping indicator may be updated in the t-th iteration as, if $d_j^{(t)}==y_j$, $u(j)=\|s_j\|$; otherwise, $u(j)=\|s_j\|+a$. a can be of various values. For example, if a is set to 1, $u(j)=\|s_j\|+1$ when $d_j^{(t)}$ is not equal to $y_j$. Put alternatively, the flipping indicator may be updated to be set to the value of the number of unsatisfied check nodes connected with variable node j during the decoding iteration of variable node j if the hard decision (e.g., hard channel information) from variable node j is equal to the channel output (e.g., corrupted channel output). Otherwise, the flipping indicator may be set to a value that is altered by a factor of a.

At step 506, it is determined whether a bit-flip operation is to be performed on the variable node by comparing the flipping indicator with the flipping threshold. For example, if the flipping indicator is greater than the flipping threshold, then the bit may be flipped. If the flipping indicator is less than or equal to the flipping threshold, then the bit may not be flipped, or alternatively, may be set to the value of the variable node in a previous iteration. Put alternatively in terms of variables, For $0 \leq j \leq N-1$, compare u(j) and T. If $u(j)>T$, $d_j^{(t)}=1-d_j^{(t-1)}$; otherwise $d_j^{(t)}=d_j^{(t-1)}$, where N is the number of columns in the LDPC matrix (e.g., the number of codewords).

At step 508, the flipping threshold associated with the decoding process may be updated. The flipping threshold may be an adaptive flipping threshold that is configured to adapt (e.g., change) as is necessary during the decoding process in order to improve the likelihood of successful (and accurate decoding).

To generate the adaptive flipping threshold T, the iteration number, the number of unsatisfied check nodes of a previous iteration, and the number of variable nodes flipped in the previous iteration are taken into account. Assuming p is the number of variable nodes flipped in the previous iteration, the following algorithm disclosed below may be used, although those of skill in the art will understand alternative suitable algorithms that may be utilized without departing from the invention disclosed herein:

If (t==0) and ($\|s\|<\beta_1$), T=$\delta_1$;
Else if (t==0), T=$\delta_1-1$;
Else if (t==1), T=$\delta_1$;
Else if (p==0), T=T-1;
Else if (t>ε) and ($\|s\| \leq \beta_2$), T=$\delta_2$;
Else if ($\|s\|<\beta_3$) and (p>$\theta_1$) and (T+1)<$\delta_3$, T=T+1;
Else if ($\|s\|<\beta_3$) and (p>$\theta_1$), T=$\delta_3$;
Else if (p≤$\theta_2$) and (($\|s\|>\beta_3$), T=max($\delta_4$, T-1).
Else T=T The variables ($\beta_1, \beta_2, \beta_3, \delta_1, \delta_2, \delta_3, \delta_4, \theta_1, \theta_2, \varepsilon$) are a group of parameters which can be configured adaptively. For example: ($\beta_1, \beta_2, \beta_3, \delta_1, \delta_2, \delta_3, \delta_4, \theta_1, \theta_2, \varepsilon$)=(50, 20, 9999, 5, 4, 5, 3, 10, 10, 10). These parameters may be related to code parameters and can be determined by simulations for different optimal targets, such as to achieve the best error correction performance or to gain the fastest convergence speed.

At step 510, steps 502, 504, 506 and 508 may be repeated for a subsequent decoding iteration and a subsequent variable node if decoding is unsuccessful. At step 512, the decoding process is ended if decoding is successful or if a maximum number of iterations is reached. For example, the decoding process may be ended if the decoding is successful, which may be determined by whether the number of unsatisfied check nodes is equal to zero, or if the decoding process has reached a maximum number of decoding iterations, which may be set to a number of codewords to be decoded or other factors as will be understood to those of skill in the art from the disclosure herein.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A memory system, comprising:
a memory storage; and
an error correcting code (ECC) unit suitable for:
determining a number of unsatisfied check nodes of a channel output in a decoding iteration of a decoding process;
updating a flipping indicator of a variable node, wherein the flipping indicator is based on at least two conditions including hard channel information of the variable node;
comparing the flipping indicator of the variable node with a flipping threshold associated with the decoding process;
flipping a bit of the variable node when the flipping indicator is greater than the flipping threshold;
updating the flipping threshold associated with the decoding process iteratively based on at least two conditions including an iteration number of the decoding process and a condition of a previous decoding iteration; and
ending the decoding process when decoding is determined to be successful or a maximal iteration number is reached.

2. The memory system of claim 1, wherein another condition on which updating the flipping indicator of the variable node is based includes a number of unsatisfied check nodes adjacent to the variable node.

3. The memory system of claim 1, wherein the ECC unit is further suitable for updating the flipping indicator of the variable node by setting the flipping indicator of the variable node to the determined number of unsatisfied check nodes in the decoding iteration when the hard channel information of the variable node is equal to the channel output of the decoding iteration of the variable node.

4. The memory system of claim 1, wherein the condition of the previous decoding iteration includes a number of unsatisfied check nodes of the previous decoding iteration, or a number of variable nodes flipped in the previous decoding iteration.

5. The memory system of claim 1, wherein the ECC unit is further suitable for determining the decoding process is successful when a determined number of unsatisfied checks is zero.

6. A method, comprising:
determining a number of unsatisfied check nodes of a channel output in a decoding iteration of a decoding process;
updating a flipping indicator of a variable node, wherein the flipping indicator is based on at least two conditions including hard channel information of the variable node and a condition of a previous decoding iteration;
comparing the flipping indicator of the variable node with a flipping threshold associated with the decoding process;
flipping a bit of the variable node when the flipping indicator is greater than the flipping threshold;
updating the flipping threshold associated with the decoding process iteratively based on at least two conditions including an iteration number of the decoding process; and
ending the decoding process when decoding is determined to be successful or a maximal iteration number is reached.

7. The method of claim 6, wherein another condition on which updating the flipping indicator of the variable node is based includes a number of unsatisfied check nodes adjacent to the variable node.

8. The method of claim 6, further comprising updating the flipping indicator of the variable node by setting the flipping indicator of the variable node to the determined number of unsatisfied check nodes in the decoding iteration when the hard channel information of the variable node is equal to the channel output of the decoding iteration of the variable node.

9. The method of claim 6, wherein the condition of the previous decoding iteration includes a number of unsatisfied check nodes of the previous decoding iteration, or a number of variable nodes flipped in the previous decoding iteration.

10. The method of claim 6, further comprising determining the decoding process is successful when a determined number of unsatisfied checks is zero.

11. A memory device, comprising:
a memory storage; and
an error correcting code (ECC) unit configured to:
determine a number of unsatisfied check nodes of a channel output in a decoding iteration of a decoding process;
update a flipping indicator of a variable node, wherein the flipping indicator is based on at least two conditions including hard channel information of the variable node;
compare the flipping indicator of the variable node with a flipping threshold associated with the decoding process;
flip a bit of the variable node when the flipping indicator is greater than the flipping threshold;
updating the flipping threshold associated with the decoding process iteratively based on at least two conditions including an iteration number of the decoding process and a condition of a previous decoding iteration; and
end the decoding process when decoding is determined to be successful or a maximal iteration number is reached.

12. The memory device of claim 11, wherein another condition on which updating the flipping indicator of the variable node is based includes a number of unsatisfied check nodes adjacent to the variable node.

13. The memory device of claim 11, wherein the ECC unit is further configured to update the flipping indicator of the variable node by setting the flipping indicator of the variable node to the determined number of unsatisfied check nodes in the decoding iteration when the hard channel information of the variable node is equal to the channel output of the decoding iteration of the variable node.

14. The memory device of claim 10, wherein the condition of the previous decoding iteration includes a number of unsatisfied check nodes of the previous decoding iteration, or a number of variable nodes flipped in the previous decoding iteration.

15. The memory device of claim 11, wherein the ECC unit is further configured to determine the decoding process is successful when a determined number of unsatisfied checks is zero.

* * * * *